United States Patent

Funada et al.

[11] Patent Number: 6,078,229
[45] Date of Patent: Jun. 20, 2000

[54] SURFACE ACOUSTIC WAVE DEVICE MOUNTED WITH A RESIN FILM AND METHOD OF MAKING SAME

[75] Inventors: Yoshitsugu Funada; Michinobu Tanioka, both of Tokyo, Japan

[73] Assignee: NEC Corporation, Tokyo, Japan

[21] Appl. No.: 09/128,782

[22] Filed: Aug. 4, 1998

[30] Foreign Application Priority Data

Aug. 5, 1997 [JP] Japan ................................. 9-210851

[51] Int. Cl.⁷ ............................. H03H 9/05; H03H 9/64
[52] U.S. Cl. ................ 333/193; 310/313 R; 310/313 B; 310/348; 29/25.35; 360/807
[58] Field of Search ................................. 333/193–196, 333/150, 151, 152, 153, 154, 155; 310/313 R, 313 B, 313 C, 313 D, 344, 345, 348, 349; 361/760, 807, 812; 29/25.35

[56] References Cited

U.S. PATENT DOCUMENTS

| 5,359,494 | 10/1994 | Morimoto | 310/313 R X |
| 5,699,027 | 12/1997 | Tsuji et al. | 333/193 |
| 5,760,526 | 6/1998 | Anderson | 310/340 X |

FOREIGN PATENT DOCUMENTS

| 4-56510 | 2/1992 | Japan | 310/313 B |
| 4-150512 | 5/1992 | Japan | 310/313 B |
| 4-258008 | 9/1992 | Japan | 333/193 |
| 5-90882 | 4/1993 | Japan | 333/193 |
| 5-90883 | 4/1993 | Japan | 333/193 |
| 8204497 | 8/1996 | Japan | |

*Primary Examiner*—Robert Pascal
*Assistant Examiner*—Barbara Summons
*Attorney, Agent, or Firm*—Sughrue, Mion, Zinn, Macpeak & Seas, PLLC

[57] ABSTRACT

It is an object on the invention to provide a SAW device sealed by resin, which is low priced and suited for decreasing its thickness and weight and requires no particular course for processing a substrate, and a method for fabricating the same. A functional surface of a piezoelectric substrate provided with interdigtal transducers and a mounting surface of a circuit substrate are opposed to each other to form vibration cavities for surface wave propagation areas therebetween. Electrical power is supplied to the piezoelectric substrate from the circuit substrate via electrode pads formed on respective inner surface of both the substrate and bumps inserted therebetween. A resin film adheres to the respective inner surfaces of both the substrates except the surface wave propagation areas to shield the vibration cavity from the environmental space. Apertures are previously formed at predetermined parts of the resin film by means of a laser. A resin film is temporarily adhered to the inner surface of the circuit substrate for instance, and positioning of both the substrates are adjusted relative to each other. Thereafter, both the substrates are permanently adhered to each other by hot-pressing them, and sealing is completed.

18 Claims, 5 Drawing Sheets

SURFACE ACOUSTIC WAVE DEVICE MOUNTED WITH A RESIN FILM AND METHOD OF MAKING SAME

FIELD OF THE INVENTION

The invention relates to a surface acoustic wave device (a SAW device, hereinafter) serving as a surface acoustic wave filter, and especially to a SAW device, which is mounted on a circuit substrate in a way of face-down and sealed by resin.

BACKGROUND OF THE INVENTION

A wireless terminal set, represented by a portable telephone set, is now being lighter in weight, thinner in thickness and smaller in size, and in conformity with the recent tendency, miniaturized parts and a method for mounting them on a substrate are actively developed. A SAW device is a frequency-selecting device utilizing a wave propagated along a surface of an elastic body, and frequently used in a high frequency circuit. The fundamental structure of the SAW device is that interdigital transducers, which reversibly convert electrical signals into surface acoustic waves, are formed on the surface of a piezoelectric substrate. The interdigital transducer is formed by the use of thin film-forming and photolithography technologies. Material of the interdigital transducer is Al in most cases, and its width is in the order of micron to submicron meter.

The SAW device is composed of a piezoelectric substrate and a circuit substrate. The piezoelectric substrate is provided with the interdigital transducers and surface wave propagation areas on its functional surface, and mounted on the mounting surface of the circuit substrate. The functional surface of the piezoelectric substrate and the mounting surface of the circuit substrate are opposed to each other, and the circuit substrate supplies electrical power to the interdigital transducers via electrode pads respectively formed on both the substrates and bumps inserted between the electrode pads.

In order to protect the interdigital transducers with minute widths from the environmental space, it is indispensable to seal the SAW device. Moreover, in order to secure certain propagation of the surface waves, it is necessary to form vibration cavities over the surface wave propagation areas.

Earnest efforts have been made to meet the aforementioned requirements. For example, a SAW device sealed by a metallic casing is the most reliable from the view points of sealing capability, mechanical strength and shielding property against external electro-magnetic waves, but unfavorable from the aspects of cost, weight and size. In the other structure of the SAW device, a hollow is formed on a part of the circuit substrate opposing to the surface wave propagation areas in order to secure the vibration cavity. However, since the shape of the circuit substrate is particular, the cost of production is high, and it is difficult to achieve satisfactory sealing capability.

SUMMARY OF THE INVENTION

Accordingly, it is an object of the invention to provide a surface acoustic wave device sealed by resin, which is low priced and suited for decreasing its thickness and weight, and requires no particular course for processing a substrate.

It is a further object of the invention to provide a method for fabricating a surface acoustic wave device, in which a resin film is temporarily adhered to a mounting surface of a circuit substrate at first.

It is a still further object of the invention to provide a method for fabricating a surface acoustic wave device, in which a resin film is temporarily adhered to a functional surface of a piezoelectric substrate at first.

It is a yet further object of the invention to provide a method for fabricating a surface acoustic wave device, in which apertures are previously formed at predetermined parts of a resin film, before it is temporarily adhered to a surface of a substrate.

According to the first feature of the invention, a surface acoustic wave device comprises:

a piezoelectric substrate provided with interdigital transducers and surface wave propagation areas, both being formed on a functional surface of the piezoelectric substrate, a circuit substrate having a mounting surface thereon, wherein the functional surface of the piezoelectric substrate and the mounting surface of the circuit substrate are opposed to each other to form vibration cavities over the surface wave propagation areas, means for supplying electrical power to the interdigital transducers from the circuit substrate, and a resin film, which is adhered to both the functional surface of the piezoelectric substrate and the mounting surface of the circuit substrate to shield the vibration cavities from an external space, wherein the resin film does not cover the surface wave propagation areas.

According to the second feature of the invention, a method for fabricating a surface acoustic wave device, which comprises a piezoelectric substrate provided with interdigital transducers and surface wave propagation areas, both being formed on a functional surface of the piezoelectric substrate, and a circuit substrate having a mounting surface thereon, and are formed by combining the piezoelectric substrate with the circuit substrate, making the functional surface of the piezoelectric substrate oppose to the mounting surface of the circuit substrate, to form vibration cavities over the surface wave propagation areas, and provided with means for supplying electrical power to the interdigital transducers from the circuit substrate, comprises the steps of:

temporarily adhering a resin film to the mounting surface of the circuit substrate, forming apertures on predetermined parts of the temporarily adhered resin film, which respectively correspond to the surface wave propagation areas, making the functional surface of the piezoelectric substrate oppose to the mounting surface of the circuit substrate, and after positioning of the piezoelectric and circuit substrates is adjusted relative to each other, permanently adhering both the substrates to each other via the resin film by hot-pressing them.

According to the third feature of the invention, a method for fabricating a surface acoustic wave device, which comprises a piezoelectric substrate provided with interdigital transducers and surface wave propagation areas, both being formed on a functional surface of the piezoelectric substrate, and a circuit substrate having a mounting surface thereon, and are formed by combining the piezoelectric substrate with the circuit substrate, making the functional surface of the piezoelectric substrate oppose to the mounting surface of the circuit substrate, to form vibration cavities over the surface wave propagation areas, and provided with means for supplying electrical power to the interdigital transducers from the circuit substrate, comprises the steps of:

temporarily adhering a resin film to the functional surface of the piezoelectric substrate, forming apertures on predetermined parts of the temporarily adhered resin film, which respectively correspond to the surface wave propagation areas, making the functional surface of the piezoelectric substrate oppose to the mounting surface of the circuit substrate, and after positioning of the piezoelectric and circuit substrates is adjusted relative to each other, permanently adhering both the substrates to each other via the resin film by hot-pressing them.

According to the fourth feature of the invention, a method for fabricating a surface acoustic wave device, which comprises a piezoelectric substrate provided with interdigital transducers and surface wave propagation areas, both being formed on a functional surface of the piezoelectric substrate, and a circuit substrate having a mounting surface thereon, and are formed by combining the piezoelectric substrate with the circuit substrate, making the functional surface of the piezoelectric substrate oppose to the mounting surface of the circuit substrate, to form vibration cavities over the surface wave propagation areas, and provided with means for supplying electrical power to the interdigital transducers from the circuit substrate, comprised the step of:

forming apertures on predetermined parts of a resin film to be situated between the functional surface of the piezoelectric substrate and the mounting surface of the circuit substrate, positions of the predetermined parts of the resin film respectively corresponding to the surface wave propagation areas, temporarily adhering the resin film to a surface selected from the functional surface of the piezoelectric substrate and the mounting surface of the circuit substrate, making the functional surface of the piezoelectric substrate oppose to the mounting surface of the circuit substrate, and after positioning of the piezoelectric and circuit substrates is adjusted relative to each other, permanently adhering both the substrates to each other via the resin film by hot-pressing them.

BRIEF DESCRIPTION OF THE INVENTION

The invention will be explained in more detail in conjunction with appended drawings, wherein.

Figure 4:
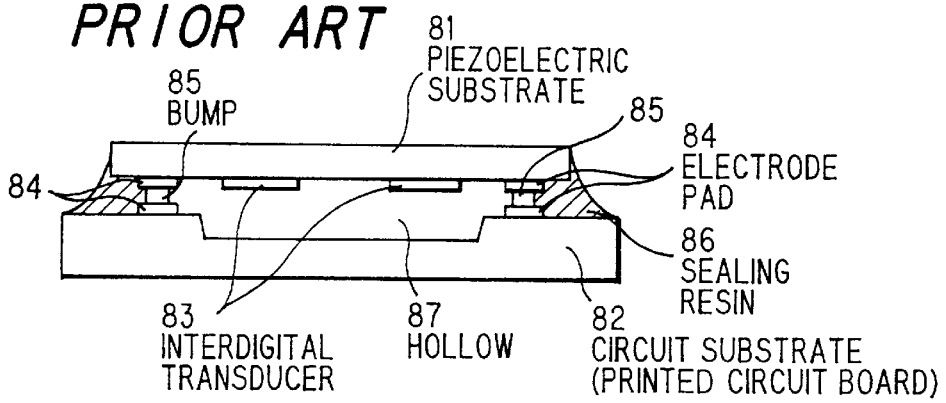
Figure 5:
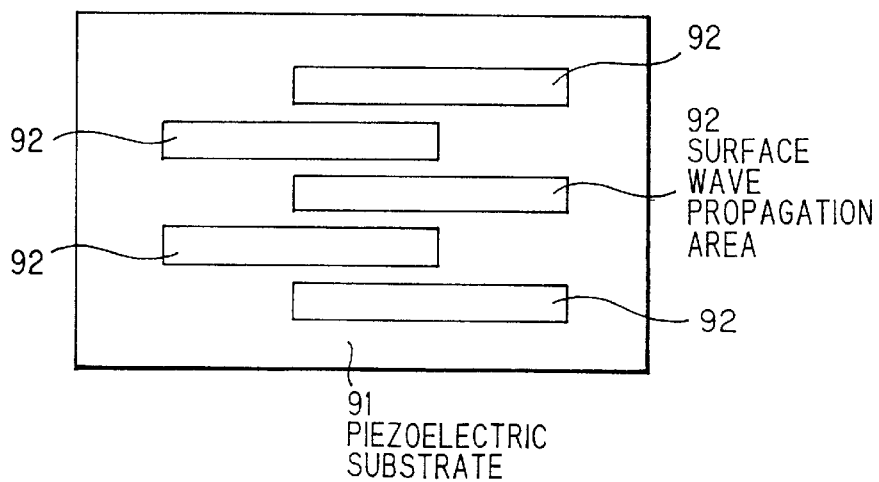
Figure 6A:
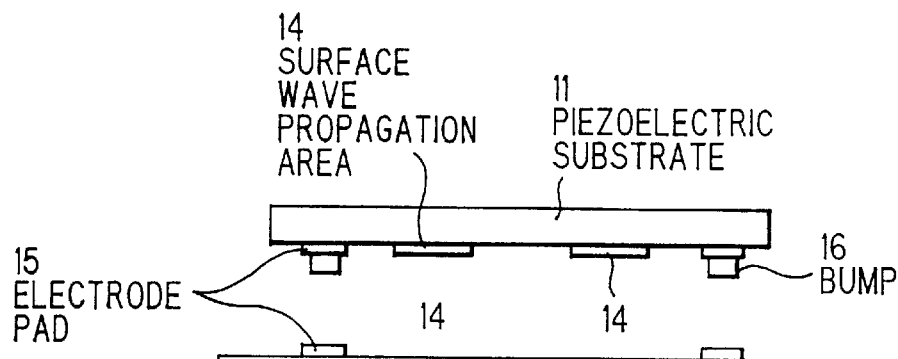
Figure 6B:
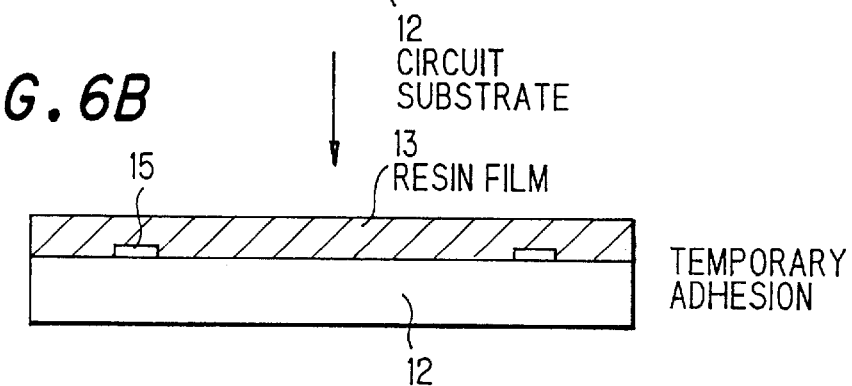
Figure 6C:
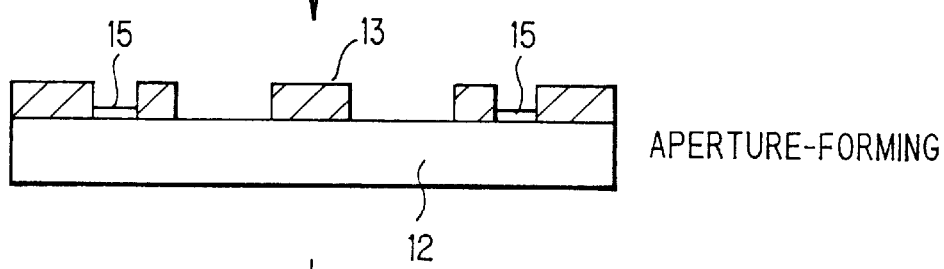
Figure 6D:
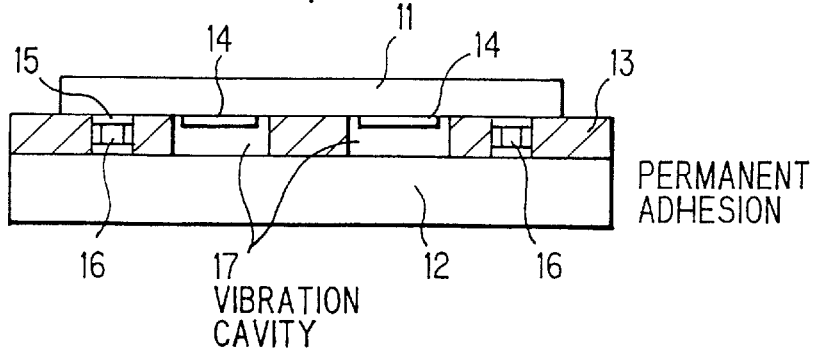
Figure 7A:
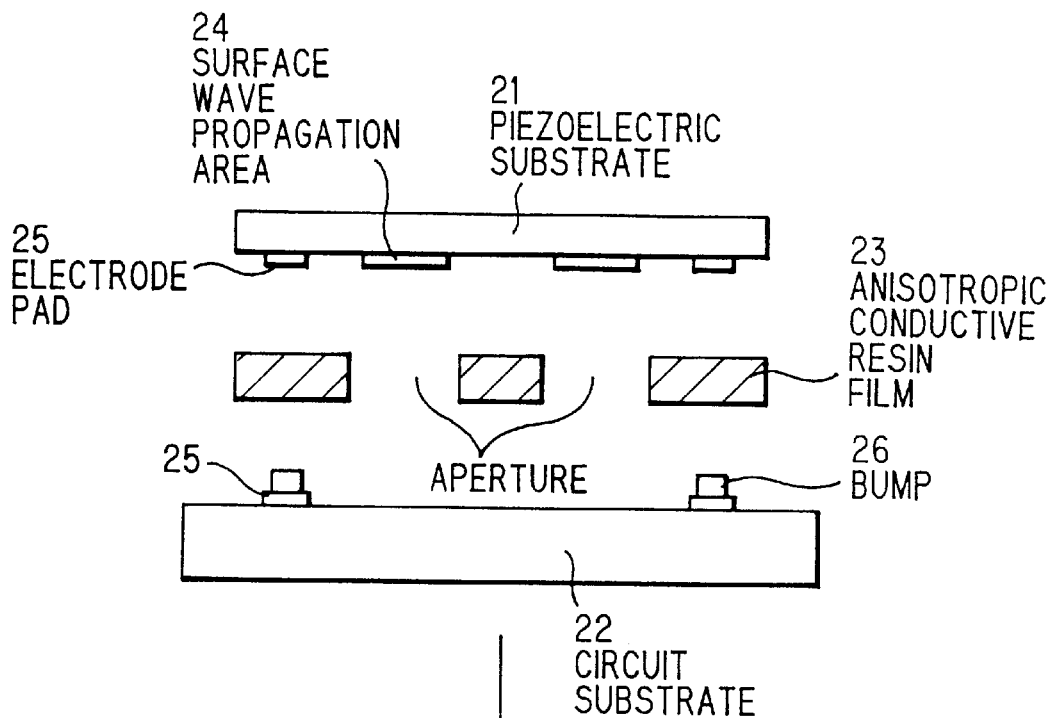
Figure 7B:
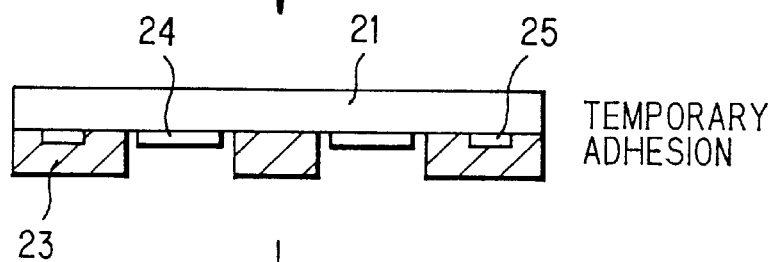
Figure 7C:
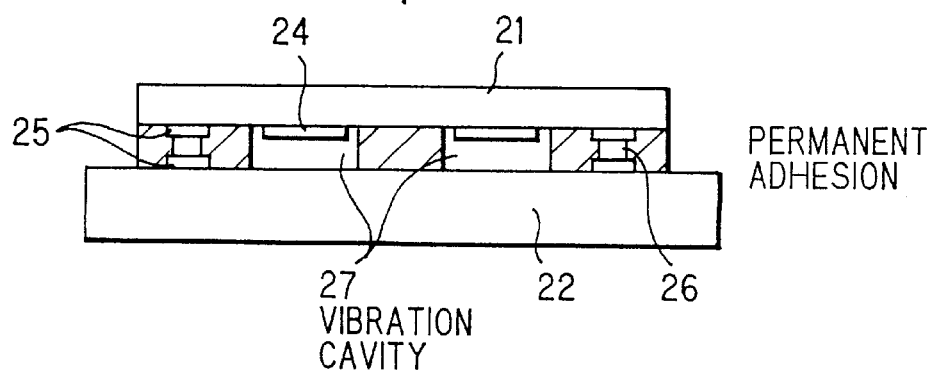
Figure 8:
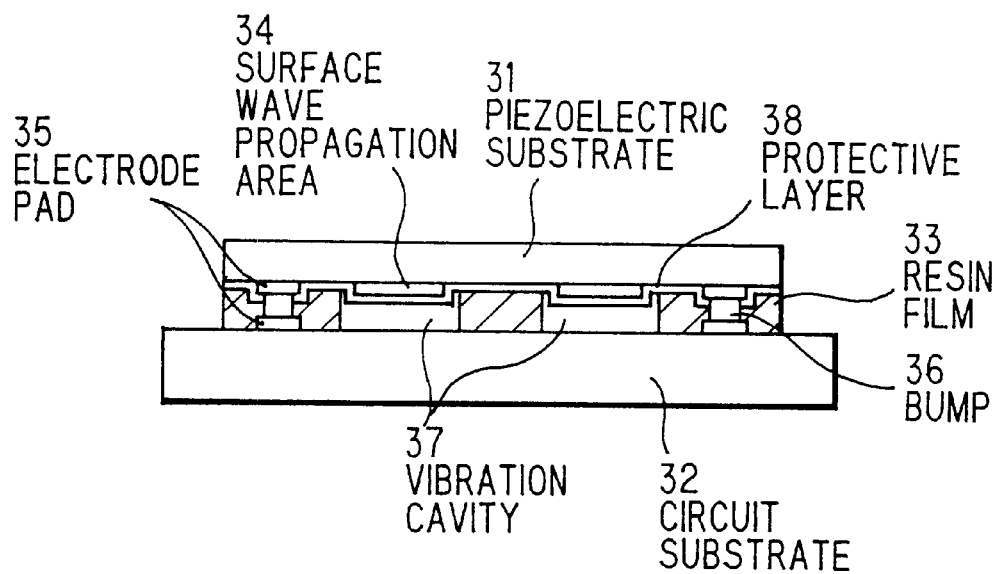
Figure 9:
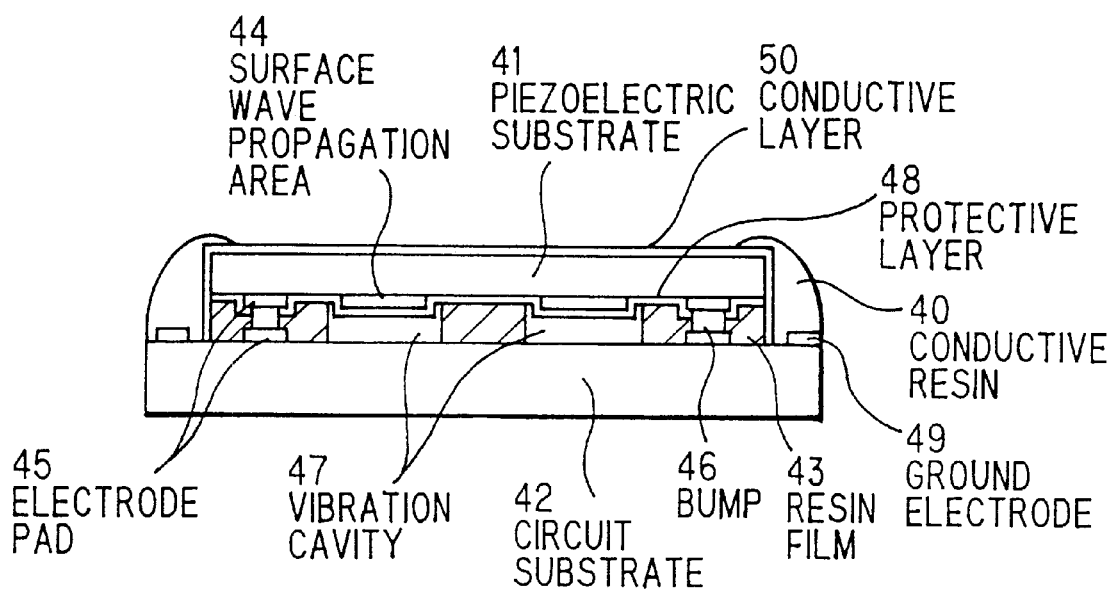

FIG. 4 shows a cross-sectional view of another example of a conventional SAW device, FIG. 5 shows a top view of plural surface wave propagation areas arranged in parallel with each other on a piezoelectric substrate, FIG. 6A to 6D shows cross-sectional views of a SAW device according to the first preferred embodiment of the invention and a method for fabricating the same, FIG. 7A to 7C shows cross-sectional views of a SAW device according to the second preferred embodiment of the invention and a method for fabricating the same, FIG. 8 shows a cross-sectional view of the third preferred embodiment of the invention, and FIG. 9 shows a cross-sectional view of the fourth preferred embodiment of the invention.

DESCRIPTION OF THE PREFERRED EMBODIMENTS

Before explaining a surface acoustic wave device and a method for fabricating the same in the preferred embodiments according to the invention, the aforementioned conventional surface acoustic wave device will be explained.

Figure 1:
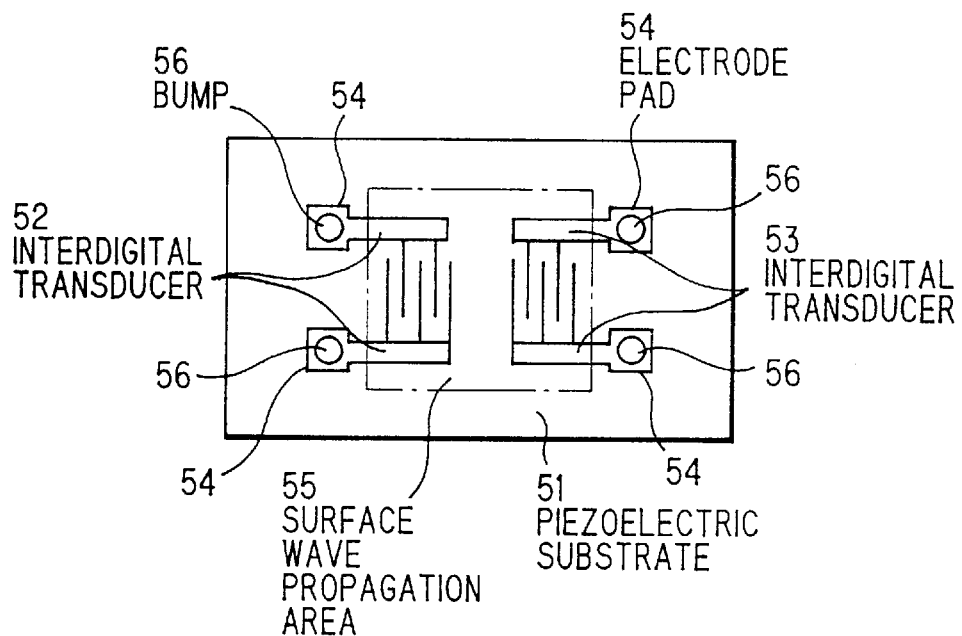
FIG. 1 shows a top view of an example of a conventional SAW device.
Figure 2:
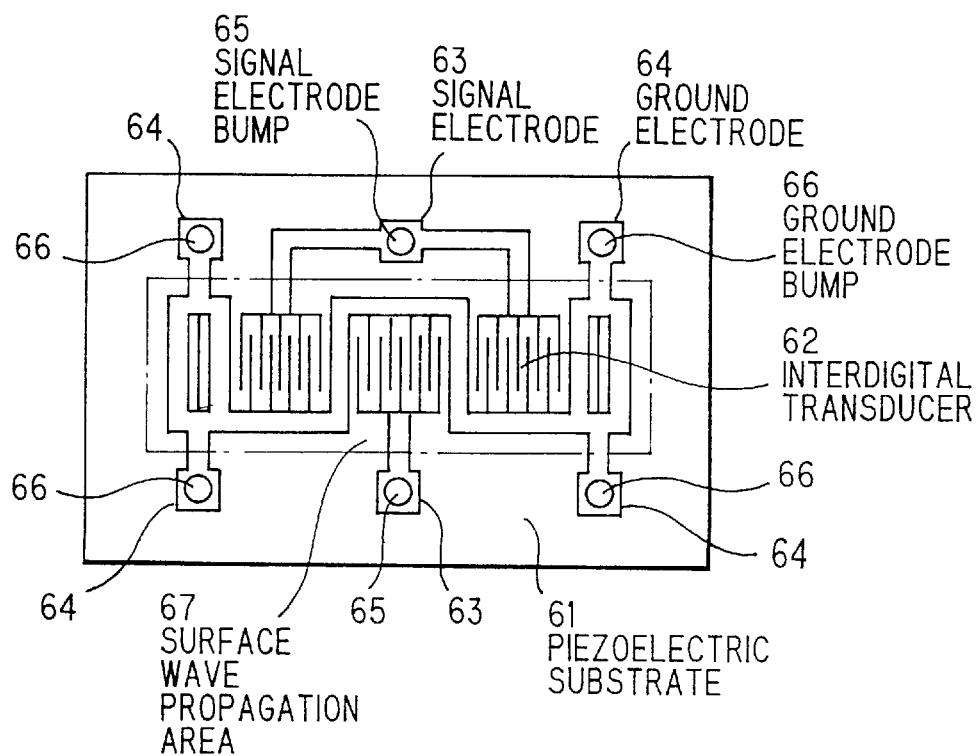
FIG. 2 shows a top view of another example of a conventional SAW device.

FIG. 1 shows an example of a conventional SAW device. A surface wave propagation area 55 provided with a pair of interdigital transducers, 52 and 53, near both the side ends thereof and electrode pads 54 for supplying electrical power to the interdigital transducers are formed on the functional surface of a piezoelectric substrate 51. The bumps 56 for electrically connecting the piezoelectric substrate 55 with a circuit substrate (not shown) are respectively formed on the side ends of the interdigital transducers. FIG. 2 shows another example of a conventional SAW device. Similarly to the case of FIG. 1, a surface wave propagation area 67 provided with interdigital transducers 62 and electrode pads (signal electrodes 63 and ground electrodes 64) are formed on a functional surface of a piezoelectric substrate 61. Bumps (signal electrode bumps 65 and ground electrode bumps 66) are respectively formed on electrode pads.

Figure 3:
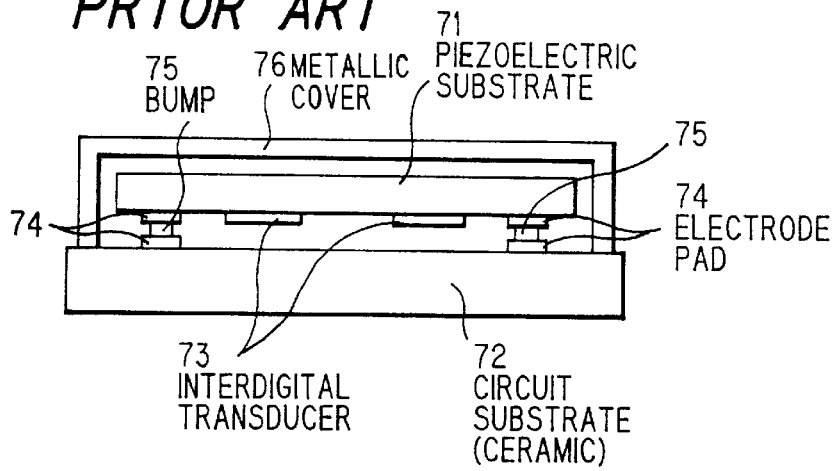
FIG. 3 shows a cross-sectional view of an example of a conventional SAW device.

In order to protect minute electrodes from the environment, it is indispensable to seal the SAW device. Moreover, it is necessary to form a free space over a surface wave propagation area not to suppress a propagation of a surface wave. That is to say, free spaces must be formed over the surface wave propagation areas 55 and 67 respectively shown in FIGS. 1 and 2. Then, the sealing structure of the SAW device, which contains a cavity in itself, becomes necessary. FIG. 3 shows an example of a conventional SAW device. A pair of interdigital transducers 73 and electrode pads 74 for supplying electrical power to the interdigital transducers are formed on a functional surface of a piezoelectric substrate 71 formed of quartz. Bumps 75, which electrically connect the piezoelectric substrate 71 with a circuit substrate 72, are formed on the electrode pads 74, and electrical power is supplied to the interdigital transducer from the circuit substrate via the electrode pads and the bumps. The functional surface of the piezoelectric substrate 71 and the mounting surface of the circuit substrate 72 are opposed to each other. After the positioning of both substrates are adjusted relative to each other, electrical conduction therebetween can be completed. Thereafter, both substrates are sealed by metallic material to form an airtight sealing.

FIG. 4 shows a SAW device disclosed in Japanese Patent Kokai 8-204497. A functional surface of a piezoelectric substrate 81, which is formed in a way similar to that in the case of FIG. 3, and a mounting surface of a printed circuit board 82 are opposed to each other, and electrical conduction therebetween is completed. A hollow 87 is formed at a part of the mounting surface of the printed circuit board, which opposes to surface wave propagation areas, and the outer periphery of the SAW device is covered with sealing resin.

Since the conventional SAW device shown in FIG. 3 is sealed by metallic plates, it is highly reliable. However, since this SAW device comprises a metallic frame or a metallic cover, it is difficult to decrease thickness, weight and cost of the SAW device. The cost of fabrication of the other conventional SAW device shown in FIG. 4 is high, because the shape of the substrate is particular. Since the outer periphery of the SAW device is sealed by liquid resin, the cost of material low. However, since there is a clearance between both the substrate, which corresponds to the height of the bumps, it is difficult to prevent penetration of liquid resin into the vibration cavity from the peripheral space. Moreover, in case that plural surface wave propagation areas 92 are formed on a piezoelectric substrate 91 as shown in FIG. 5 and liquid resin is used in order to seal the SAW device, resin can not lie between the surface wave propagation areas and satisfactory sealing property cannot be obtained.

Next, preferred embodiments of the invention will be explained referring to appended drawings. FIG. 6A to 6D show a case where two surface wave propagation areas are formed on a piezoelectric substrate, and a method for fabricating the first SAW device. FIG. 6D shows a cross-sectional view of the first SAW device fabricated in this way. The surface wave propagation areas 14 and electrode pads 15 are formed on the piezoelectric substrate 11. On the other hand, the electrode pads 15 are formed on a ceramic circuit substrate 12 also (FIG. 6A). Next, a resin film 13, which does not contain conductive particles, is temporarily adhered to a mounting surface (an inner surface, hereinafter) of the circuit substrate (FIG. 6B). Subsequently, on the resin film 13, apertures are formed by means of a laser above the electrode pads 15 and over regions corresponding to the surface wave propagating areas 14 formed on the piezoelectric substrate 11 (FIG. 6C). Finally, after the positioning of the piezoelectric substrate 11 relative to the circuit substrate 12 is adjusted, they are permanently adhered to each other by hot-pressing them in a way of face-down, and sealing is completed. In this way, the SAW device, which contains vibration cavities 17 for the surface wave propagation areas 14 in itself(FIG. 6D) can be fabricated.

FIG. 7A to 7C show the second SAW device (FIG. 7C) and the method for fabricating the same. On predetermined parts of an anisotropic conductive film 23, which respectively correspond to surface-wave propagation areas 24, apertures are previously formed by means of a laser. Then, a piezoelectric substrate 21 and a circuit substrate 22, which are to be joined with each other via the aforementioned resin film 23, are previously set up (FIG. 7A). Subsequently, after the positioning of the apertures formed on the anisotropic conductive film 23 is adjusted relative to the surface-wave propagation areas 24 formed on the piezoelectric substrate 21, the anisotropic conductive film 23 and the piezoelectric substrate 21 are temporarily adhered to each other (FIG. 7B). Finally, after the positioning of the piezoelectric substrate 21 and the circuit substrate 22 is adjusted relative to each other, they are permanently adhered to each other by hot-pressing them in a way of face-down, and sealing is completed. In this way, a SAW device, which contains vibration cavities 27 for the surface-wave propagation areas 24 in itself, can be fabricated (FIG. 7C).

The difference in the structure between the first and second SAW devices depends on whether clearances exist around the bumps or not. In the SAW devices shown as the embodiments of the invention, their sides and backs are exposed, but their sides and backs may be covered with liquid resin at need.

FIG. 8 shows an example of a SAW device fabricated by the method shown in FIGS. 7A to 7C, in which a protective layer 38 is formed over a functional surface (an inner surface, hereinafter) of the piezoelectric substrate 38.

FIG. 9 shows an example of a shielding structure of an embodiment, in which a ground electrode 49 formed around the outer periphery of the circuit substrate 42 is electrically connected with a conductive layer 50 formed on the back and the side of the piezoelectric substrate 41 via conductive resin 40. In the structure shown in FIG. 9, the conductive layer 50 is formed on the back and the side of the piezoelectric substrate 41, but the conductive layer 50 may be formed only on the back of the piezoelectric substrate 41. Moreover, conductive resin 40 is formed only on the side of the piezoelectric substrate 41, but conductive resin 40 may be formed on both the side and the back of the piezoelectric substrate 41.

The invention will be explained in more detail. There is no limitation on material of the piezoelectric substrate used in the SAW device according to the invention. For example, quartz, $LiTaO_3$ or $LiNbO_3$ can be enumerated. There is no limitation on material of the circuit substrate. For example, a ceramic substrate such as $Al_2O_3$, a glass-ceramic substrate, or a printed circuit board, such as FR-4, can be suitably selected at need. Sealing resin used in the embodiment of the invention is shaped into a film. Thermosetting resin is especially advisable for a view point of reliability. For example, film shaped epoxy resin is suited for this purpose, and thermosetting epoxy resin for an anistropic conductive film on the market is especially advisable because of its short thermohardening time. Filler of various kinds can be mixed with aforementioned resin at need. Especially, it is desirable to mix inorganic filler, such as $SiO_2$ particles, with resin from view points of increase of mechanical strength, decrease of thermal expansion coefficient and improvement of waterproof property. The thickness of resin film should be nearly the same as the sum of the thicknesses of the electrode pads, which are respectively formed on the piezoelectric and circuit substrates, and the height of the bump, which is electrically connected with both the electrode pads. If the thickness of resin is thicker than the aforementioned value, the electrical conduction between the substrates becomes unsatisfactory, and excess resin penetrates into the surface wave propagation areas. If the thickness of resin is thinner than the aforementioned value, sealing capability of resin film become unsatisfactory. Moreover, the bumps maybe formed either on the piezoelectric substrate or on the circuit substrate.

As mentioned in the above, it is necessary to form a cavity on the surface wave propagation area formed on the piezoelectric substrate. However, it has been confirmed that the function of the piezoelectric substrate including the surface wave propagation area is never affected in case that a thin protective layer, a thickness of which is about 1000 Å, is formed on the inner surface of the piezoelectric substrate. This protective layer is effective for preventing adhesion of alien bodies to the surface wave propagation area, and fulfills a function similar to that of a passivation layer of a semiconductor chip. Inorganic material, such as $SiO_2$ or SiN, and organic material, such as polyimide, can be enumerated as material of the protective layer. The former can be formed on the inner surface of the piezoelectric substrate by spattering, and the latter by spray-coating or spin-coating.

The SAW device can be fabricated into a shielding structure, which is resisting against the external electromagnetic wave, by forming conductive layers on the back and the side of the piezoelectric substrate and electrically connecting them with the ground electrode. There is no limitation on material of the conductive layers, which are formed on the back and the side of the piezoelectric substrate, and a metallic layer and a conductive resin layer can be applied. The former can be formed by spattering, and the latter by printing. There is no limitation on the method for electrically connecting the conductive layers, which are formed on the back and the side of the piezoelectric substrate, with the ground electrode, but the electrical connection by means of conductive resin is simple and advisable.

Next, a method for fabricating a SAW device will be explained. A protective layer is previously formed on the inner surface of the piezoelectric substrate at need. In order to obtain high reliability, it is advisable that the protective layer is not formed on the electrode pads. In case that an organic thin layer, such as a polyimide layer, is formed on the inner surface of the piezoelectric substrate as the protective layer, if a bump with a pointed end exists on a electrode pad formed on the opposite circuit substrate, a satisfactory electrical contact can be obtained, because the pointed end of the bump breaks through the protective layer.

First, a resin film is temporarily adhered to an inner surface of a substrate selected from the piezoelectric and circuit substrates. Thermohardening of the resin film does not proceed at the temperature of temporary adhesion, and, in general, the aforementioned temperature is nearly the same as glass transition temperature of a resin film. In case that an anisotropic conductive resin film available on the market is used, the resin film is temporarily adhered at 80–100° C., usually. Next, apertures are formed on the parts of the resin film, which respectively correspond to the surface wave propagation areas, where the apertures are slightly larger than the surface wave propagation areas. It is advisable to form the apertures by means of a laser, but other means can be adopted. In case that the aperture is formed by means of a laser, an irradiated portion is considerably heated, though it is instantaneous. Material of the underlying piezoelectric or circuit substrate should be so selected that the substrate is not damaged by laser heat. For example, in case that the aperture is formed on the resin film adhered to the circuit substrate, it is not desirable to use a printed circuit board, but advisable to use a ceramic substrate. When the aperture is formed by means of a laser, since the inner periphery of the aperture is thermohardened by laser heat, resin does not flow. However, since resin is not yet thermohardened except the inner periphery of the aperture, resin can be permanently adhered to the opposite substrate by later mentioned hot-pressing. Accordingly, resin does not penetrate into the surface wave propagation areas and contact with them. As mentioned in the above, in case that the apertures are formed only on the parts of the resin film, which correspond to the surface wave propagation areas, an anisotropic conductive resin film is used. In case that the apertures are formed on both the parts, which respectively correspond to the surface wave propagation areas and the electrode pads, there is no necessity for using the anisotropic conductive resin film. After the apertures are formed on the predetermined parts of the resin film and the positioning of both the substrates is adjusted relative to each other, both the substrates are permanently adhered to each other by hot-pressing them via the resin film, and resin sealing is completed. In case that a resin film is temporarily adhered to the inner surface of the circuit substrate and the apertures are formed on the predetermined parts of the resin film, there is no necessity for perfectly penetrating and removing the resin film. When the piezoelectric and circuit substrates are joined with each other, the SAW device can fulfill its function in case that it is provided with vibration cavities on the surface wave propagation areas. Accordingly, no problem occurs even in case that a resin layer, which is thinner than the height of the bump, still remains on the inner surface of the circuit substrate. Moreover, no problem occurs in case that leavings, such as filler contained in resin, adhere to the inner surface of the circuit substrate, if they do not peel off. Accordingly, the resin layer on the predetermined parts can be removed by grinding.

In another embodiment for fabrication a SAW device, the apertures are previously formed on the predetermined parts of the resin film, which respectively correspond to the surface wave propagation areas, and the resin film provided with the apertures is adhered to an inner surface of a substrate selected from the piezoelectric and circuit substrates. In this structure, no consideration is necessary on material of the substrate, which is distinct from the previous embodiment. The apertures can be formed on the resin film by punching.

As mentioned in the above, according to the embodiments of the invention, since the SAW device can be sealed by resin and no special step for processing the substrate is necessary, the SAW device can be provided at a low price. Moreover, since a metallic layer, which has been used in the conventional SAW device for forming airtight sealing, becomes unnecessary, a thin and light SAW device can be provided.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A surface acoustic wave device, comprising:
    a piezoelectric substrate provided with interdigital transducers and surface wave propagation areas, both being formed on a functional surface of said piezoelectric substrate,
    a circuit substrate having a mounting surface thereon,
    wherein said functional surface of said piezoelectric substrate and said mounting surface of said circuit substrate are opposed to each other to form vibration cavities over said surface wave propagation areas,
    means for supplying electrical power to said interdigital transducers from said circuit substrate, and
    a resin film, which is adhered to both said functional surface of said piezoelectric substrate and said mounting surface of said circuit substrate to shield said vibration cavities from an external space,
    wherein said resin film does not cover said surface wave propagation areas.

2. A surface acoustic wave device according to claim 1, wherein:
    a side and/or a back of said piezoelectric substrate are covered with conductive layers, and said conductive layers are electrically connected with a ground electrode formed on said circuit substrate.

3. A surface acoustic wave device according to claim 1, wherein:
    said resin film is a thermosetting resin film.

4. A surface acoustic wave device according to claim 3, wherein:
    said thermosetting resin film is an anisotropic conductive resin film.

5. A surface acoustic wave device according to claim 4, wherein:
    said thermosetting resin contains $SiO_2$ particles.

6. A surface acoustic wave device according to claim 1, wherein:
    said functional surface of said piezoelectric substrate is provided with a protective layer.

7. A surface acoustic wave device according to claim 1, wherein:
    said means for supplying electrical power to said interdigital transducers comprise electrode pads, which are respectively formed on said functional surface of said piezoelectric substrate and said mounting surface of said circuit substrate, and bumps respectively inserted between said electrode pads.

8. A surface acoustic wave device according to claim 7, further comprising:

clearances respectively formed around said bumps.

9. A surface acoustic wave device according to claim 8, wherein:

said resin film is a thermosetting resin film.

10. A surface acoustic wave device according to claim 9, wherein:

said thermosetting resin contains $SiO_2$ particles.

11. A surface acoustic wave device according to claim 8, wherein:

said functional surface of said piezoelectric substrate is provided with a protective layer.

12. A surface acoustic wave device according to claim 8, wherein:

a side and/or a back of said piezoelectric substrate are covered with conductive layers, and said conductive layers are electrically connected with a ground electrode formed on said circuit substrate.

13. A method for fabricating a surface acoustic wave device, which comprises a piezoelectric substrate provided with interdigital transducers and surface wave propagation areas, both being formed on a functional surface of said piezoelectric substrate, and a circuit substrate having a mounting surface thereon, and are formed by combining said piezoelectric substrate with said circuit substrate, making said functional surface of said piezoelectric substrate oppose to said mounting surface of said circuit substrate, to form vibration cavities over said surface wave propagation areas, and provided with means for supplying electrical power to said interdigital transducers from said circuit substrate, comprising the steps of:

temporarily adhering a resin film to said mounting surface of said circuit substrate, forming apertures on predetermined parts of said temporarily adhered resin film, which respectively correspond to said surface wave propagation areas, making said functional surface of said piezoelectric substrate oppose to said mounting surface of said circuit substrate, and after positioning of said piezoelectric and circuit substrates is adjusted relative to each other, permanently adhering both said substrates to each other via said resin film by hot-pressing them.

14. A method for fabricating a surface acoustic wave device according to claim 13, wherein:

said step of forming apertures on said predetermined parts of said resin film is carried out by means of a laser.

15. A method for fabricating a surface acoustic wave device, which comprises a piezoelectric substrate provided with interdigital transducers and surface wave propagation areas, both being formed on a functional surface of said piezoelectric substrate, and a circuit substrate having a mounting surface thereon, and are formed by combining said piezoelectric substrate with said circuit substrate, making said functional surface of said piezoelectric substrate oppose to said mounting surface of said circuit substrate, to form vibration cavities over said surface wave propagation areas, and provided with means for supplying electrical power to said interdigital transducers from said circuit substrate, comprising the steps of:

temporarily adhering a resin film to said functional surface of said piezoelectric substrate, forming apertures on predetermined parts of said temporarily adhered resin film, which respectively correspond to said surface wave propagation areas, making said functional surface of said piezoelectric substrate oppose to said mounting surface of said circuit substrate, and after positioning of said piezoelectric and circuit substrates is adjusted relative to each other, permanently adhering both said substrates to each other via said resin film by hot-pressing them.

16. A method for fabricating a surface acoustic wave device according to claim 15, wherein:

said step of forming apertures on said predetermined parts of said resin film is carried out by means of a laser.

17. A method for fabricating a surface acoustic wave device, which comprises a piezoelectric substrate provided with interdigital transducers and surface wave propagation areas, both being formed on a functional surface of said piezoelectric substrate, and a circuit substrate having a mounting surface thereon, and are formed by combining said piezoelectric substrate with said circuit substrate, making said functional surface of said piezoelectric substrate oppose to said mounting surface of said circuit substrate, to form vibration cavities over said surface wave propagation areas, and provided with means for supplying electrical power to said interdigital transducers from said circuit substrate, comprising the steps of:

forming apertures on predetermined parts of a resin film to be situated between said functional surface of said piezoelectric substrate and said mounting surface of said circuit substrate, positions of said predetermined parts of said resin film respectively corresponding to said surface wave propagation areas, temporarily adhering said resin film to a surface selected from said functional surface of said piezoelectric substrate and said mounting surface of said circuit substrate, making said functional surface of said piezoelectric substrate oppose to said mounting surface of said circuit substrate, and after positioning of said piezoelectric and circuit substrates is adjusted relative to each other, permanently adhering both said substrates to each other via said resin film by hot-pressing them.

18. A method for fabricating a surface acoustic wave device according to claim 17, wherein:

said step of forming apertures on said predetermined parts of said resin film is carried out by means of a laser.

* * * * *

UNITED STATES PATENT AND TRADEMARK OFFICE
CERTIFICATE OF CORRECTION

Page 1 of 1

PATENT NO. : 6,078,229
DATED : June 20, 2000
INVENTOR(S) : Yoshitsugu Funada and Michinobu Tanioka It is certified that error appears in the above-identified patent and that said Letters Patent is hereby corrected as shown below:

<u>Title page,</u>
"References Cited", add the following:

| | | |
|---|---|---|
| 09-162693 | 6/20/97 | Japan |
| 07-111438 | 4/25/95 | Japan |
| 07-99420 | 4/11/95 | Japan |
| 06-85524 | 12/6/94 | Japan |
| 05-55303 | 3/5/93 | Japan |
| 52-16147 | 2/7/77 | Japan |

Signed and Sealed this

Eighteenth Day of September, 2001

Attest:

NICHOLAS P. GODICI
Attesting Officer *Acting Director of the United States Patent and Trademark Office*